United States Patent
Yoon et al.

(10) Patent No.: US 6,269,134 B1
(45) Date of Patent: Jul. 31, 2001

(54) DATA TRANSMISSION METHOD AND APPARATUS IN PULSE AMPLITUDE MODULATION COMMUNICATION SYSTEM

(75) Inventors: Young-Bin Yoon, Seongnam; Ki-Jo Kwon, Kyeonggi-do, both of (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/119,740

(22) Filed: Jul. 21, 1998

(30) Foreign Application Priority Data

Jul. 22, 1997 (KR) ................................. 97-34248

(51) Int. Cl.[7] ....................................... H03K 7/02
(52) U.S. Cl. ..................... 375/353; 375/295; 332/115
(58) Field of Search .................................. 375/353, 296, 375/300, 295, 286, 243, 254, 285; 332/106, 107, 115, 159, 162; 455/108, 115, 126; 370/533; 341/144

(56) References Cited

U.S. PATENT DOCUMENTS 5,854,812 * 12/1998 Huber et al. ...................... 375/296

OTHER PUBLICATIONS

Digital Communications Fundamentals and Applications, Prentice–Hall International Editions, Bernard Sklar, "Formatting and Baseband Transmission", pp. 51–71, 1988.

* cited by examiner

*Primary Examiner*—Stephen Chin
*Assistant Examiner*—Betsy L. Deppe

(57) ABSTRACT

A data transmission apparatus and method in a pulse amplitude modulation (PAM) communication system that converts information to be transmitted into digital data, converts the digital signal into an analog signal, modulates the analog signal using a PAM modulator, and transmits the signal through a predetermined transmission channel. The method includes detecting distortion in the signal to be transmitted to the transmission channel; generating compensation information corresponding to the distortion detected; and changing digital data to be input to the PAM modulator based upon the compensation information generated.

18 Claims, 6 Drawing Sheets

DATA TRANSMISSION METHOD AND APPARATUS IN PULSE AMPLITUDE MODULATION COMMUNICATION SYSTEM

BACKGROUND OF THE INVENTION

1. Field of the Invention

The present invention relates to a transmission method in a communication system employing pulse amplitude modulation (PAM) to decrease errors generated when converting digital signals into analog signals.

2. Discussion of Related Art

A pulse communication method refers to a communication method for transmitting information using a rectangular pulse string as a carrier, where differences in the amplitude, width, temporal position, and/or repetition of pulses in that rectangular pulse string represent signals to be transmitted. A pulse amplitude modulation (PAM) system represents information to be transmitted by changing the amplitude of pulses in the rectangular pulse string that is used as a carrier. Since pulse amplitude modulation (PAM) changes only the amplitude of pulses in the carrier, the temporal position of a pulse string and pulse width remain constant. Thus, the configurations of a modulator and demodulator in this system are simple. However, in such a system, noise at the input translates into noise at the output.

FIG. 1 is a block diagram of a transmitter for transmitting data in a conventional data transmit-receive device employing a PAM system. The transmitter largely consists of: digital circuit 100 for converting the information to be transmitted into binary data; and PAM modulator 200 for converting the binary data transmitted from digital circuit 100 into analog signals, and for modulating the analog signals before sending them to the predetermined channel 300. PAM modulator 200 consists of: D/A converter 210 for converting binary data input thereto into analog signals; a filter 220 for eliminating frequencies of analog signals output that are outside from D/A converter 210 predetermined critical limits; and matching unit 230 for matching the signals output from filter 220 with the characteristics of channel 300.

The operations of the conventional transmitter employing such the PAM system are as follows. Digital circuit 100 is used to convert information to be transmitted into digital information or binary data. PAM modulator 200 converts the binary data output from digital circuit 100 into analog signals according to a PAM system, and outputs those signals to channel 300.

In PAM modulator 200, D/A converter 210 converts the binary data received from digital circuit 100 into analog signals.

The signal output by D/A converter 210 is a sampling signal, Vak, corresponding to the binary data. Filter 220 eliminates frequencies that are outside predetermined critical limits from sampling signal Vak, effectively converting sampling signal Vak into a sinusoidal analog signal, Vfk. Since the sinusoidal analog signal Vfk generated by filter 220 does not match the characteristics of channel 300, matching unit 230 converts sinusoidal analog signal Vfk into a matching signal, Vok, which matches the characteristics of channel 300.

FIG. 2 is a waveform diagram illustrating a comparison between ideal and actual outputs of each component in the PAM modulator in response to a binary data output of 6 bits from digital circuit 100, showing output signal properties of each component in the conventional transmitter employing the PAM system.

As shown in FIG. 2, when the binary data generated by digital circuit 100 is converted by PAM modulator 200, the matching signal Vok generated by PAM modulator 200 becomes distorted since the properties of PAM modulator 200 are not ideal. This distortion results in erroneous data when restored to digital information by a receiver. Additionally, because the ability of systems to eliminate error is limited by the characteristics of their components, conventional systems having tolerated some degrees of deviation rather than solving the above fundamental problems.

SUMMARY OF THE INVENTION

Accordingly, the present invention is directed to a data transmission method and its apparatus in a PAM communication system that substantially obviates one or more of the limitations and disadvantages of the related art.

An object of the present invention is to provide a data transmission method and apparatus in a PAM communication system for preventing distortions from appearing in the PAM modulator output signals before they are transmitted to a channel. Depending upon the degree of the distortion, this and other objects and advantages can be accomplished by adjusting the binary data entering the PAM modulator to include information for compensating for the distortion generated by the operation of the actual PAM modulator, alone or in addition to improving the characteristics of the PAM modulator.

Additional features and advantages of the present invention will be set forth in the description which follows, and in part will be apparent from the description, or may be learned by practice of the invention. The objectives and other advantages of the invention will be realized and attained by the structure as illustrated in the written description and claims hereof, as well as the appended drawings.

To achieve these and other advantages, and in accordance with the purpose of the present invention as embodied and broadly described, a data transmission method in a PAM communication system which converts information to be transmitted into digital data, converts the digital signal to an analog signal, modulates the analog signal using a PAM modulator, and transmits the signal through a predetermined transmission channel, the method includes the steps of: measuring distortion of a signal to be transmitted to the transmission channel; generating compensation information corresponding to the distortion measured; and adjusting the digital data entering the PAM modulator based upon the compensation information generated. In the adjusting step described above, artificial distortion is generated at the digital data entering the PAM modulator based upon the compensation information generated at the generating step above.

The data transmission apparatus according to this invention includes a digital circuit for converting the input signal into the binary data; a D/A converter for converting the binary data input by the digital circuit into an analog signal; a filter for filtering the analog signal from the D/A converter according to a specified frequency limits; a matching unit for matching the signal output from the filter with the property of the transmission channel; a distortion compensation unit for altering the binary data according to predetermined compensation information before sending it to a PAM modulator, in order to minimize distortion when transmitting the signal through the transmission channel; a comparator for comparing distortion occurring when original binary data, input to a digital/analog (D/A) converter, is converted into PAM signal, filtered by a filter, and converted into a matching signal by a matching unit; and a compensation information generator for providing compensation information to the distortion compensation unit, allowing the distortion compensation unit to compensate for distortion of the original binary data according to the output of the comparator, before sending it to the D/A converter.

The distortion compensation unit contains a digital signal processor for adjusting the binary data generated by the digital circuit according to compensation information provided by the compensation information generator.

The compensation information generator contains ROM storing optimal compensation data so as to generate an address based upon the signal transmitted from the comparator, access data corresponding to the address, and generate compensation information.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide further understanding of the invention and which are incorporated in and constitute a part of this specification, illustrate embodiments of the invention that, together with the description, serve to explain the principles of the invention.

DETAILED DESCRIPTION OF PREFERRED EMBODIMENT

Reference will now be made in detail to the preferred embodiments of the present invention, examples of which are illustrated in the accompanying drawings, particularly FIGS. 3–5.

Figure 3:
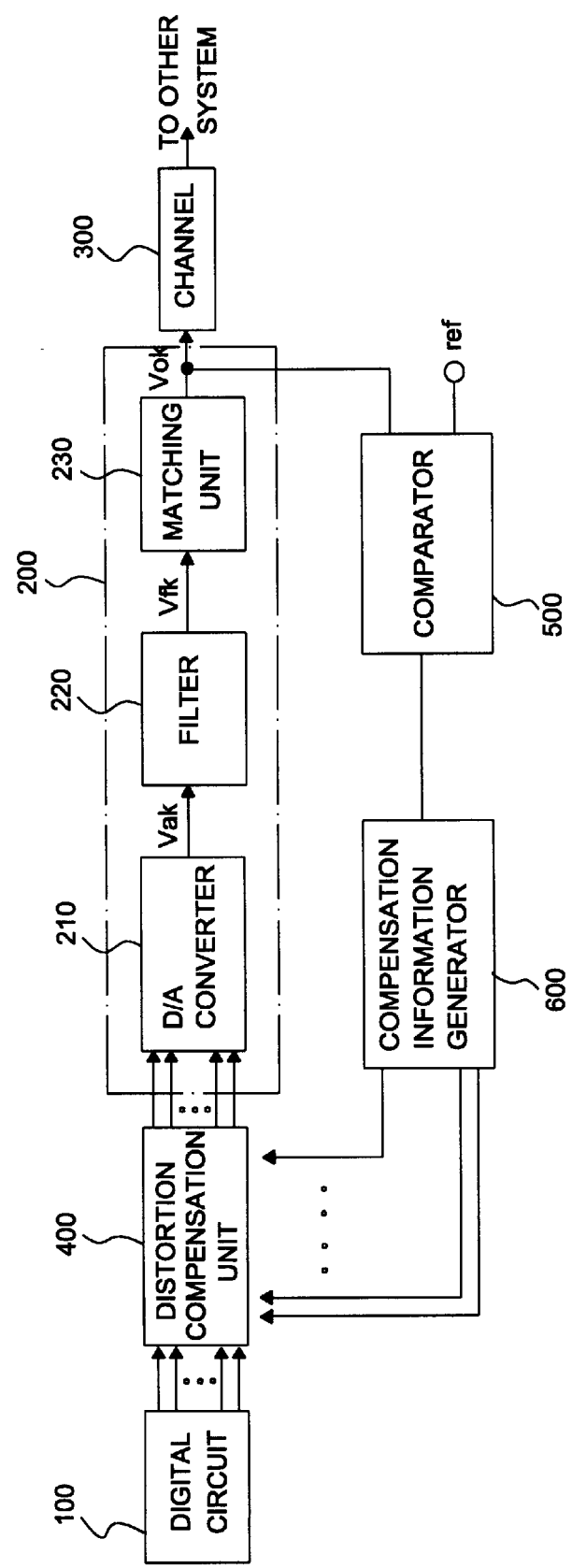
FIG. 3 is a block diagram of a transmitter in a PAM communication system according to a first preferred embodiment of the present invention.
Figure 4:
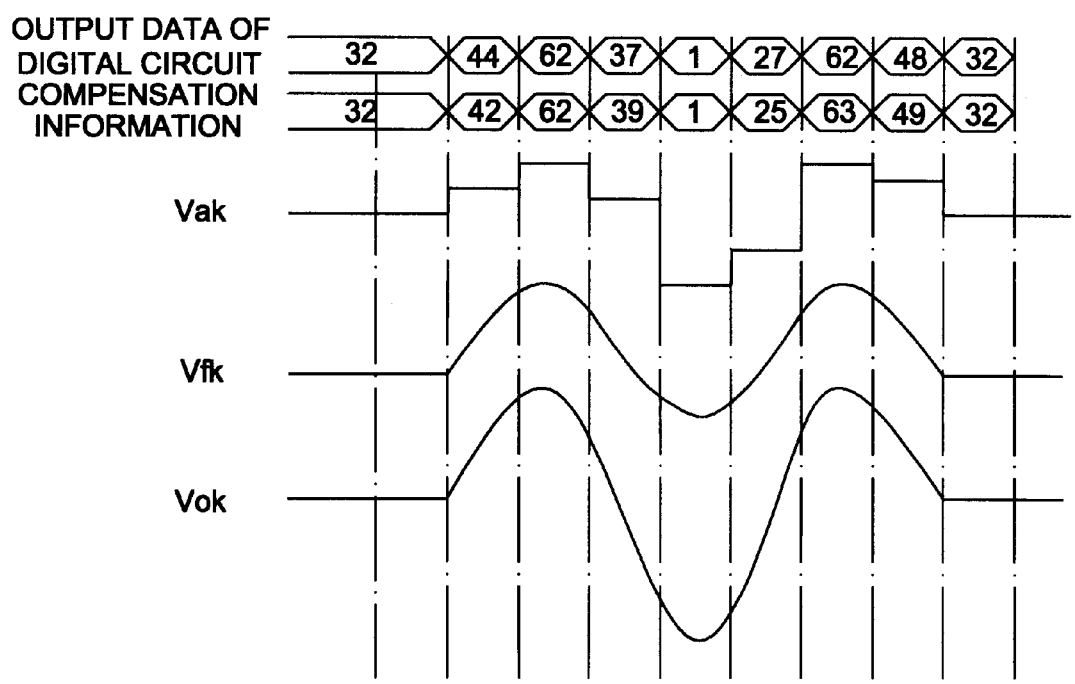
FIG. 4 is a waveform diagram illustrating waveforms of the signals generated by each component shown in FIG. 3.

As shown in FIG. 3, the transmitter of the present invention may include: digital circuit 100 for converting information into binary data; PAM modulator 200 for converting the binary data into analog signals, for modulating the analog signals, and for sending the modulated analog signals to predetermined channel 300; comparator 500 for comparing distortion degrees of signals generated by the actual operation of PAM modulator 200; compensation information generator 600 for generating an address based upon the signal output by comparator 500, and for providing compensation information to distortion compensation unit 400; and distortion compensation unit 400 for adjusting the output signal of digital circuit 100 based on the compensation information, and for providing corresponding information to PAM modulator 200 in the form of binary data.

PAM modulator 200 in this invention has the same configuration as described above with respect to the conventional art. It consists of: D/A converter 210 for converting binary data into analog signals; a filter 220 for eliminating frequencies beyond predetermined critical limits from the analog signals of D/A converter 210; and matching unit 230 for matching the output signals of filter 220 with the characteristics of channel 300.

As shown in FIG. 3, a binary signal generated by digital circuit 100 is sent to distortion compensation unit 400. Distortion compensation unit 400 receives compensation information from compensation information generator 600, adjusts the binary signal based on the received compensation information, and sends the adjusted binary signal to D/A converter 210 in PAM modulator 200. D/A converter 210 converts the binary data received from distortion compensation unit 400 into a sampling signal Vak. Filter 220 eliminates frequencies that are outside predetermined critical limits from the sampling signal Vak to produce a sinusoidal analog signal, Vfk. The sinusoidal analog signal Vfk output by filter 220, is converted into a matching signal Vok which matches the characteristics of channel 300.

Figure 1:
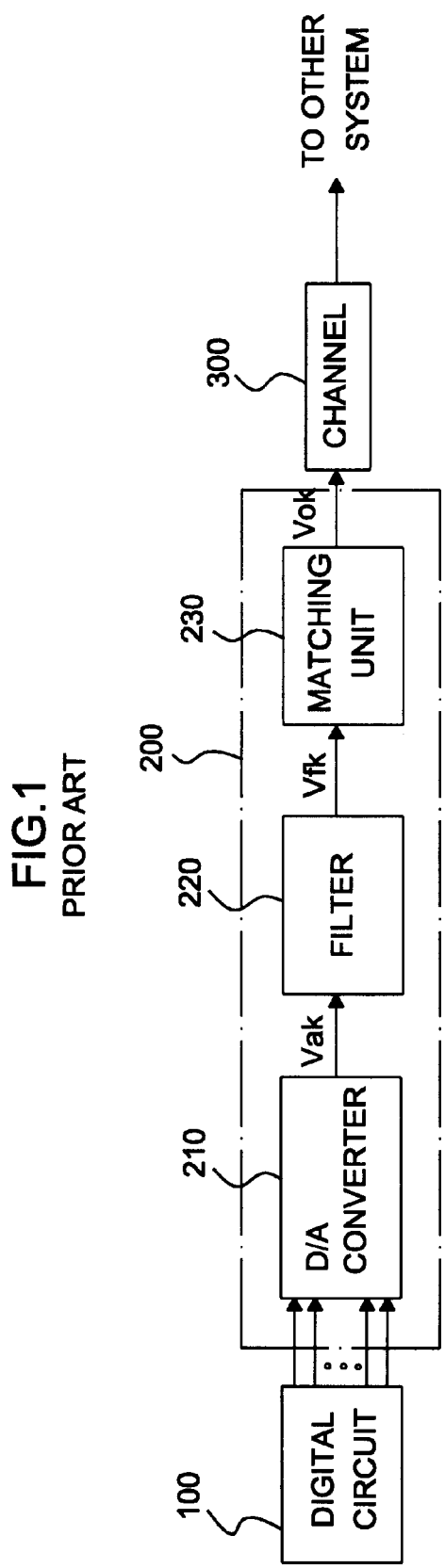
FIG. 1 is a block diagram of a transmitter which transmits data in a conventional data transmit-receive apparatus employing a PAM system.
Figure 2:
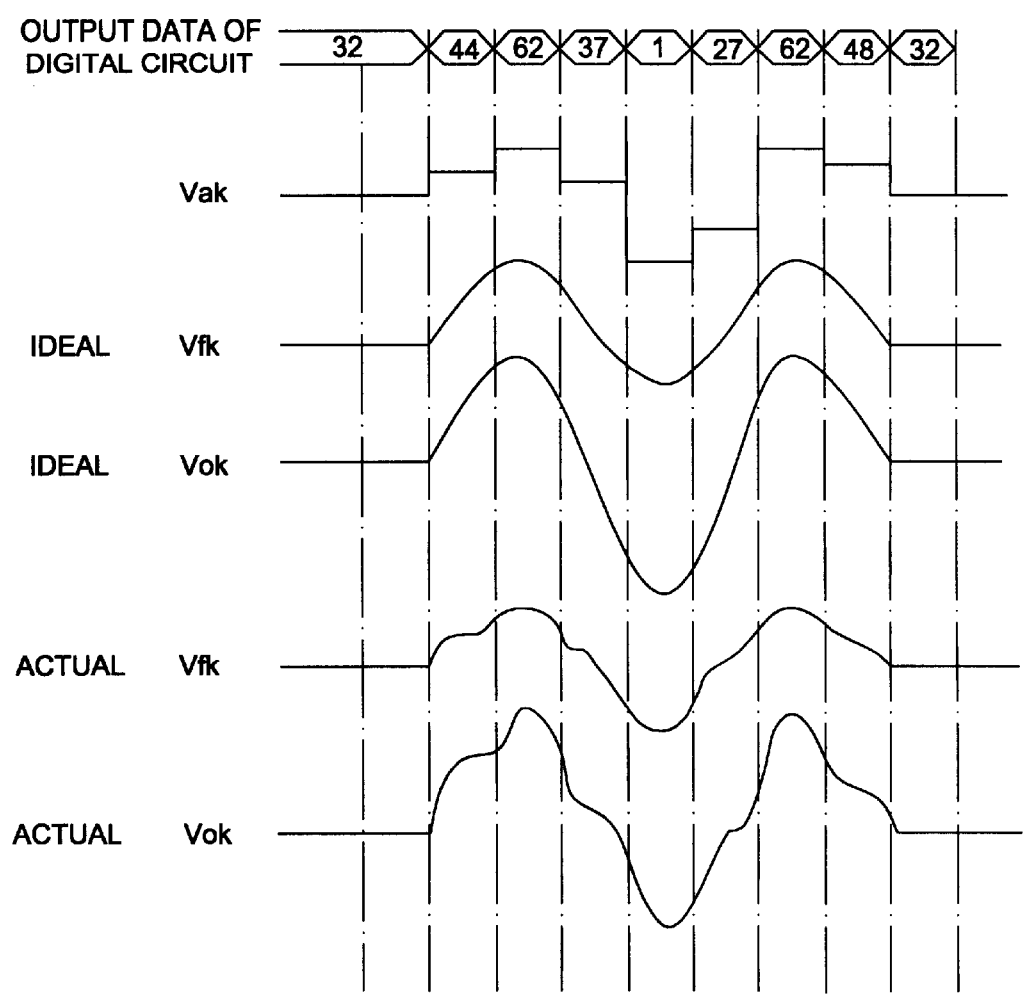
FIG. 2 is a waveform diagram illustrating waveforms of ideal and actual signals generated by each component shown in FIG. 1.

If the compensation information is not received by distortion compensation unit 400, distortion occurs in the matching signal, Vok, before it is transmitted to channel 300, as illustrated by the actual operation waveform shown in FIG. 2. Thus, a receiver receiving a signal output from channel 300 will be unable to correctly restore such a signal. The present invention therefore includes comparator 500 and comparison information generator 600. Comparator 500 detects information about the degree and phase of the distortion appearing in the matching signal Vok (as illustrated by FIG. 3) or analog signal Vfk (as illustrated by FIG. 5). Compensation information generator 600 generates compensation data corresponding to the information detected by comparator 500, and sends the compensation data to distortion compensation unit 400. Distortion compensation unit 400 adjusts the binary data transmitted from digital circuit 100 according to the compensation data. In reality, distortion compensation unit 400 distorts the data produced by digital circuit 100 based on compensation information from compensation information generator 600.

Initially, the compensation information is initialized to a value obtained when PAM modulator 200 is ideal. Thus, no correction is initially performed. When PAM modulator 200 receives and outputs a signal, the waveform of the signal output by PAM modulator 200 is compared by comparator 500 to an ideal output signal which is predetermined and generally input to comparator 500. If a distortion is detected in the waveform, the compensation information generator 600 adjusts its address and generates compensation information for minimizing the distortion occurring in the signal output by PAM modulator 200. Since the input value to the PAM modulator 200 is adjusted, distortion in the output data is minimized, as shown in FIG. 4.

Figure 6:
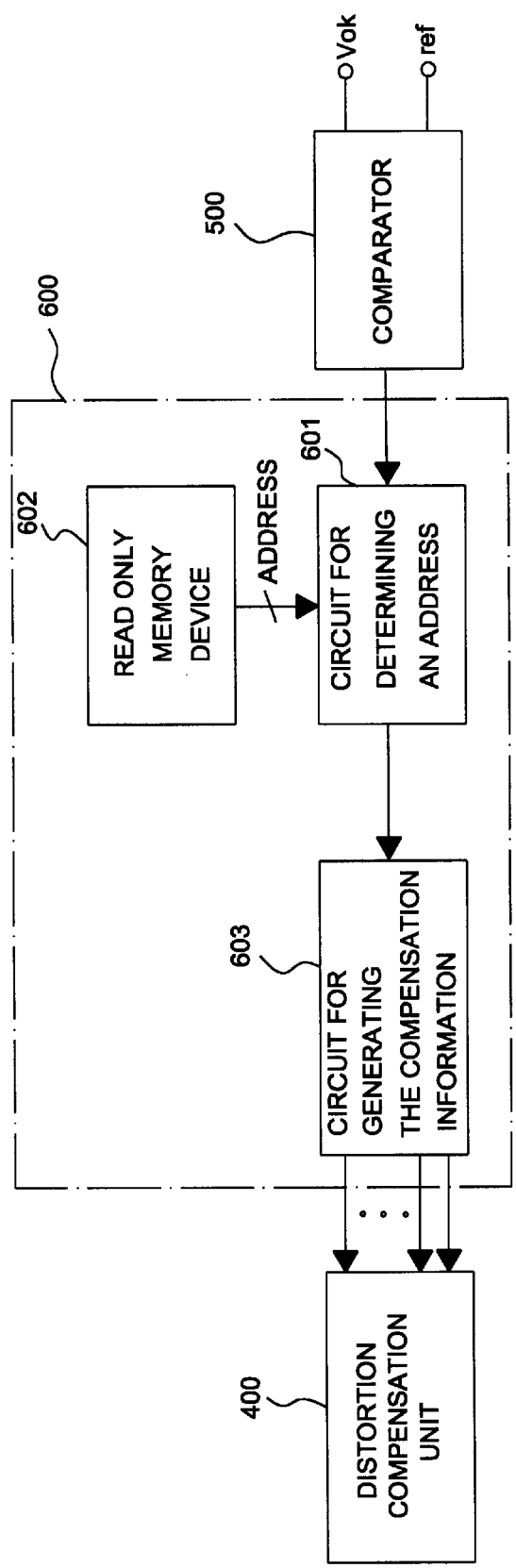
FIG. 6 is a diagram of a compensation generator.

A digital signal processor is used for distortion compensation unit 400. For compensation information generator 600, a digital signal processor or ROM 602 storing optimal control data can be used. When using a digital signal processor, compensation information generator computes compensation information based on the output from comparator 500. As shown in FIG. 6, when using ROM, compensation information generator 600 can be designed to generate an address using circuit 601 according to the value produced by comparator 500, access data corresponding to the address, and generate using circuit 603 and output compensation information based on the data accessed.

The method of determining compensation information is described as follows. After compensation information is initially set to the value obtained when PAM modulator 200 output is ideal, a binary digital signal corresponds to input from digital circuit 100 is output by distortion compensation unit 400 without correction. The original binary data output by distortion compensation unit 400 is sent to D/A converter 210 where it is converted into a sampling signal Vak through modulation. The sampling signal Vak is filtered by filter 220, and converted into a matching signal Vok by matching unit 230. Comparator 500 then detects distortion in the signal transmitted from matching unit 230. Compensation information generator 600 adjusts the compensation information according to the value detected by comparator 500, and sends the result to distortion compensation unit 400. Distortion compensation unit 400 then compensates newly received binary data from digital circuit 100 based on the compensation information, and outputs the compensated binary data. The distortion in the compensated binary data is then detected in a similar procedure, and optimal compensation information for minimizing distortion is ultimately obtained.

Figure 5:
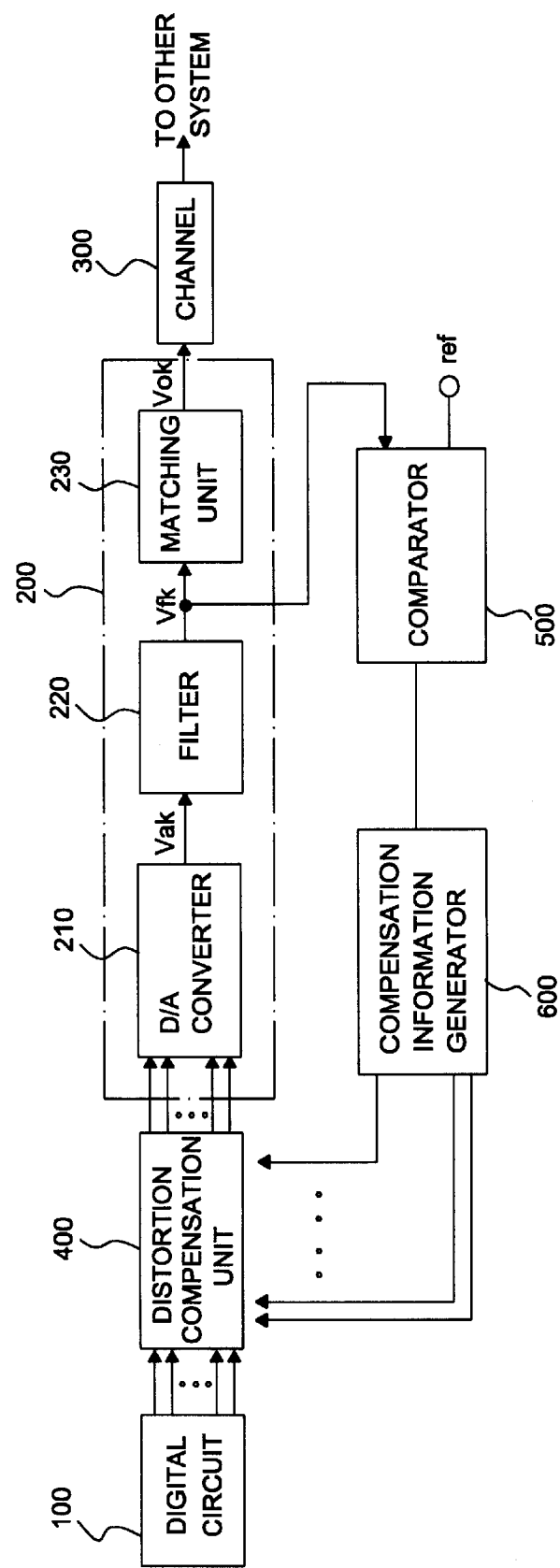
FIG. 5 is a block diagram of a transmitter in a PAM communication system according to a second preferred embodiment of the present invention.

As indicated previously and as illustrated by FIG. 5, compensation information can be derived based on the sinusoidal analog signals Vfk output from filter 220, rather than from the matching signals output from matching unit 230. Specifically, comparator 500 may be used to compare the analog signal Vfk outputs from filter 220 to an ideal reference signal ref, and the result of such comparison can be used by compensation information generator 600 to generate compensation information.

As illustrated, this invention is capable of transmitting data in a waveform matching a transmission channel by adjusting original binary data, which is input to the PAM modulator, based on distortion caused by an actual PAM operation, before transmitting the data through the transmission channel. Thus, it is possible for a receiver to restore the original binary data from the received binary data. Consequently, errors decrease in information transmission.

Additionally, when using a processor as a compensation information generator 600 for generating information used to is compensate the binary data, there is an advantage in that the compensation is easily processed by a program. Alternatively, using a ROM table allows simple and swift operation.

It will be apparent to those skilled in the art that various modifications and variations can be made in a data transmission method and apparatus for a PAM communication system of the present invention without deviating from the spirit or scope of the invention. Thus, it is intended that the present invention cover the modifications and variations of this invention provided they come within the scope of the appended claims and their equivalents.

What is claimed is:

1. A data transmission method for a pulse amplitude modulation communication system including a pulse amplitude modulator, the method comprising:

detecting distortion in a signal output from the pulse amplitude modulator by comparing the signal output from the pulse amplitude modulator to an ideal output signal;

generating compensation information corresponding to the detected distortion based on the comparison; and compensating a signal being input into the pulse amplitude modulator based on the compensation information.

2. The method recited by claim 1, wherein:

the signal from which distortion is detected in the detecting step is an analog signal, and the signal that is compensated in the compensating step is a digital data signal.

3. The method recited by claim 1, wherein:

the signal output from the pulse amplitude modulator is generated in response to a first digital data signal; and the signal being compensated in the compensating step is a second digital data signal.

4. The method recited by claim 1, further comprising:

initially setting the compensation information to a value corresponding to an ideal pulse amplitude modulator, wherein the detecting step comprises detecting distortion in an initial signal output from the pulse amplitude modulator based on an initial digital data signal input into the pulse amplitude modulator, and wherein the generating step comprises generating first compensation information corresponding to the distortion detected in the initial signal output from the pulse amplitude modulator, and wherein the compensating step comprises compensating a first digital data signal following the initial digital data signal based on the first compensation information.

5. The method recited by claim 4, wherein:

the detecting step further comprises detecting distortion appearing after the first digital data signal is compensated based on the first compensation information, the generating step further comprises generating second compensation information corresponding to the distortion detected after the first digital data signal is compensated based on the first compensation information, and the compensating step further comprises compensating a second digital data signal following the initial digital data signal based on the second compensation information.

6. The method recited by claim 4, wherein:

the detecting step further comprises detecting distortion in subsequent signals output from the pulse amplitude modulator based on subsequent digital data signals input into the pulse amplitude modulator following the initial digital data signal, the generating step further comprises generating subsequent compensation information corresponding to the distortion detected in the subsequent signals output from the pulse amplitude modulator, and the compensating step further comprises compensating the subsequent digital data signals based on the subsequent compensation information.

7. The method recited by claim 1, wherein the generating step comprises:

determining an address of a read only memory device corresponding to the distortion detected in the signal output from the pulse amplitude modulator; and generating the compensation information based on information stored at the determined address of the read only memory device.

8. The method recited by claim 1, wherein the compensating step comprises:

changing the signal being input into the pulse amplitude modulator based on the compensation information using a program processed by a digital signal processor.

9. The method recited by claim 1, further comprising:

converting information to be transmitted into digital data, converting the digital data into analog signals and modulating the analog signals using the pulse amplitude modulator, and transmitting the analog signals through a predetermined transmission channel.

10. A data transmission apparatus in a pulse amplitude modulation communication system including a pulse amplitude modulator, the apparatus comprising:

a comparator for detecting distortion in a signal output from the pulse amplitude modulator by comparing the signal output from the pulse amplitude modulator to an ideal output signal, a compensation information generator for generating compensation information corresponding to the detected distortion based on a result of the comparison; and a distortion compensation unit for compensating a signal being input into the pulse amplitude modulator based on the compensation information.

11. The apparatus recited by claim 10, wherein:

the signal from which distortion is detected by the comparator is an analog signal, and the signal that is compensated by the distortion compensation unit is a digital data signal.

12. The apparatus recited by claim 10, wherein:

the signal output from the pulse amplitude modulator is generated in response to a first digital data signal; and the signal being compensated by the distortion compensation unit is a second digital data signal.

13. The apparatus recited by claim 10, wherein:

the compensation information generator initially sets the compensation information to a value corresponding to an ideal pulse amplitude modulator, the comparator detects distortion in an initial signal output from the pulse amplitude modulator based on an initial digital data signal input into the pulse amplitude modulator, the compensation information generator generates first compensation information corresponding to the distortion detected in the initial signal output from the pulse amplitude modulator, and the distortion compensation unit compensates a first digital data signal following the initial digital data signal based on the first compensation information.

14. The apparatus recited by claim 13, wherein:

the comparator detects distortion appearing after the first digital data signal has been compensated based on the first compensation information, the compensation information generator generates second compensation information corresponding to the distortion detected after the first digital data signal has been compensated based on the first compensation information, and the distortion compensation unit compensates a second digital data signal following the initial digital data signal based on the second compensation information.

15. The apparatus recited by claim 13, wherein:

the comparator detects distortion in subsequent signals output from the pulse amplitude modulator based on subsequent digital data signals input into the pulse amplitude modulator following the initial digital data signal, the compensation information generator generates subsequent compensation information corresponding to the distortion detected in the subsequent signals output from the pulse amplitude modulator, and the distortion compensation unit compensates the subsequent digital data signals based on the subsequent compensation information.

16. The apparatus recited by claim 10, wherein the compensation information generator comprises:

a read only memory device for storing compensation data;

means for determining an address of the read only memory device corresponding to the distortion detected in the signal output from the pulse amplitude modulator; and means for generating the compensation information based on compensation data stored at the determined address of the read only memory device.

17. The apparatus recited by claim 10, wherein the distortion compensation unit comprises:

a digital signal processor for changing the signal being input into the pulse amplitude modulator based on the compensation information.

18. The apparatus recited by claim 10, further comprising:

a digital circuit for converting information to be transmitted into digital data, a pulse amplitude modulator for converting the digital data into analog signals, for filtering the analog signals based on specific frequency limits, and for matching the filtered analog signals with properties of a transmission channel.

* * * * *